(12) United States Patent
Mikagi (10) Patent No.: US 6,274,923 B1
(45) Date of Patent: Aug. 14, 2001

(54) SEMICONDUCTOR DEVICE AND METHOD FOR MAKING THE SAME

(75) Inventor: Kaoru Mikagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/329,130

(22) Filed: Jun. 9, 1999

(30) Foreign Application Priority Data

Jun. 12, 1998 (JP) .................................................. 10-165732

(51) Int. Cl.[7] .................................................. H01L 23/58
(52) U.S. Cl. .................. 257/642; 257/759; 257/773; 257/774
(58) Field of Search .................. 438/623, 624, 438/637, 639, 650, 769, 775, 776, 791; 257/642, 773, 774, 775, 759, 760

(56) References Cited

U.S. PATENT DOCUMENTS

| 5,482,894 | * | 1/1996 | Havemann | 437/195 |
| 5,759,906 | * | 6/1998 | Lou | 438/623 |
| 6,127,256 | * | 10/2000 | Matsuno | 438/624 |
| 6,184,126 | * | 2/2001 | Lee et al. | 438/637 |

FOREIGN PATENT DOCUMENTS 4-28232   1/1992   (JP) .

OTHER PUBLICATIONS

Edelstein, D.C., et al., Picosecond Propagation on Multilevel Copper–Polyimide Back End of the Lone Interconnections, VMIC Conference, Jun. 8–9, 1993, pp. 511–513.*

"Dual Damascene Copper Metallization Processing Using Chemical–Mechanical Polishing", by S. Lakshiminarayanan, et al., Proceedings of 1994 VLSI Multilevel Interconnection Conference, pp. 49–55, 1994.

* cited by examiner

Primary Examiner—Eddie Lee
Assistant Examiner—N. Drew Richards
(74) Attorney, Agent, or Firm—Scully, Scott, Murphy & Presser (57) ABSTRACT

A semiconductor device having: a first interconnect or electrode formed on a substrate; an organic insulation film which is formed covering the first interconnect or electrode and in which an interconnect trench and an interlayer connection hole reaching from the interconnect trench to the first interconnect or electrode are formed; an inorganic insulation film which is formed covering the side of the interconnect trench and the interlayer connection hole, and into at least surface part of which nitrogen is introduced; a second interconnect or electrode buried into the interconnect trench through the inorganic insulation film; and a buried conductive layer which is formed in the interlayer connection hole and connects between the between the first interconnect or electrode and the second interconnect or electrode.

6 Claims, 8 Drawing Sheets

SEMICONDUCTOR DEVICE AND METHOD FOR MAKING THE SAME

FIELD OF THE INVENTION

This invention relates to a semiconductor device, and more particularly to, a semiconductor device with a trench interconnect that is buried into an interconnect trench formed in organic insulation film, and relates to a method for making the semiconductor device.

BACKGROUND OF THE INVENTION

Along with the development in micro-structuring of semiconductor device, Cu films with a low resistivity have been used instead of Al film. Also, with the formation of multilayer interconnects, the planarization of surface is further desired. Thus, a so-called trench interconnect formed by burying conductive film into a trench formed in interlayer insulation film has been used.

Figure 1A:
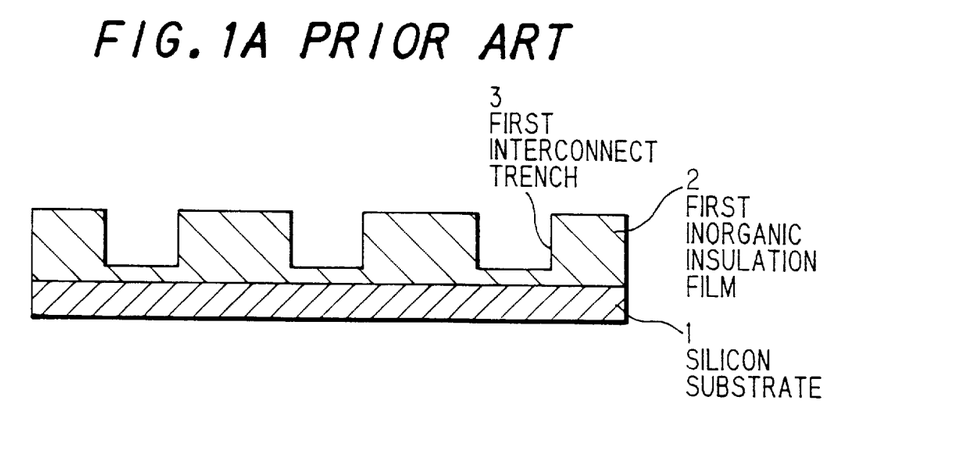
FIGS. 1A to 1F are cross sectional views showing the conventional method for making a semiconductor device with trench interconnect.

A known method for forming the trench interconnect of copper (Cu) buried into a trench that is formed in inorganic insulation film is described in S. Lakshminarayanan et al., "Dual Damascene Copper Metallization Processing Using Chemical-Mechanical Polishing", Proceedings of 1994 VLSI Multilevel Interconnection Conference, pp. 49–55, 1994. Referring to FIGS. 1A to 1F, this method is explained. First, as shown in FIG. 1A, first inorganic film 2 of about 2 μm thick is deposited on a silicon substrate 1, and then a first interconnect trench 3 of about 500 nm deep is formed by dry etching.

Figure 1B:
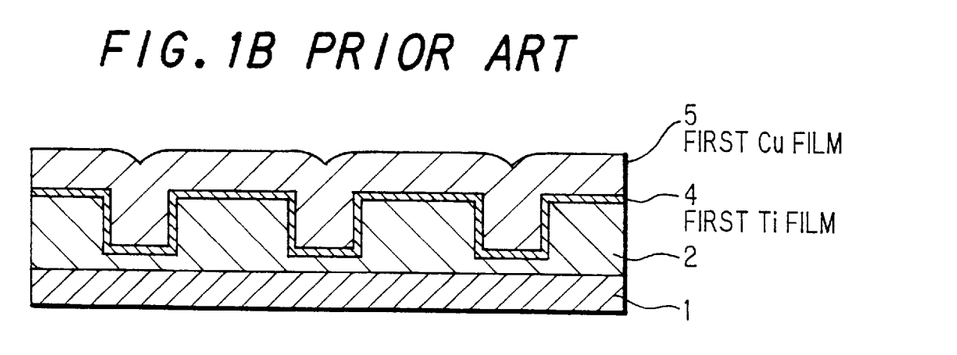

Then, as shown in FIG. 1B, first Ti film 4 and first Cu film 5 are sequentially deposited by sputtering, thereby the first interconnect trench 3 is filled with.

Figure 1C:
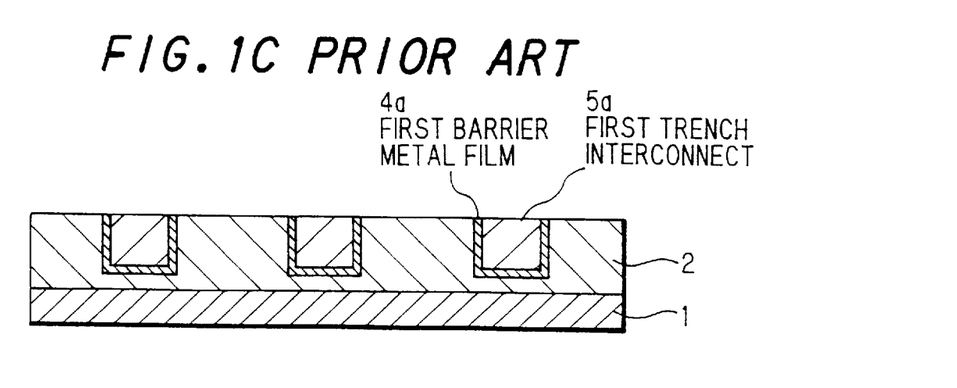

Then, as shown in FIG. 1C, the first Cu film 5 is removed polishing by the CMP (chemical mechanical polishing) method, and further the first Ti film 4 is removed using diluted hydrofluoric acid. Thus, a first trench interconnect 5a of the first Cu film 5 and a barrier metal layer 4a of the first Ti film 4 are formed.

Further, though not shown, implanting boron (B) onto the surface of the first trench interconnect 5a, a protection layer is formed on the surface of the first trench interconnect 5a.

Figure 1D:
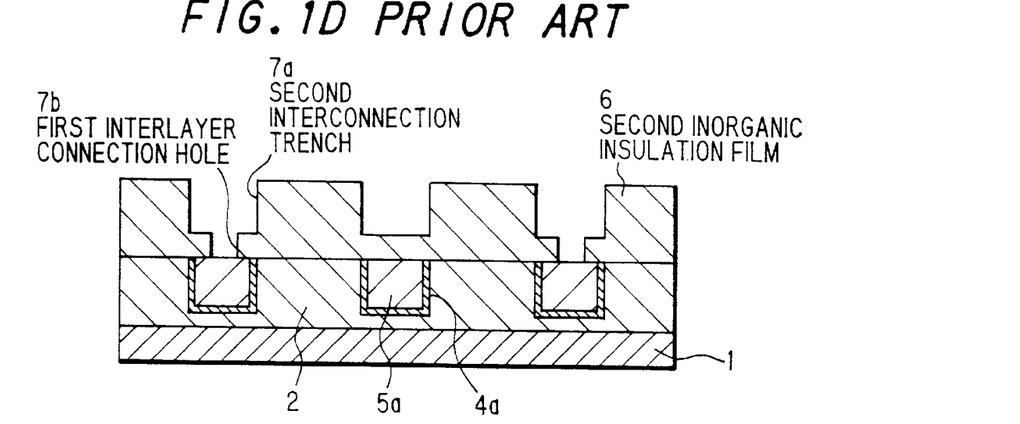

Then, as shown in FIG. 1D, second inorganic insulation film 6 of silicon oxide is formed on the entire surface, and then a second interconnect trench 7a and a first interlayer connection hole 7b are formed by photolithography and dry etching.

Figure 1E:
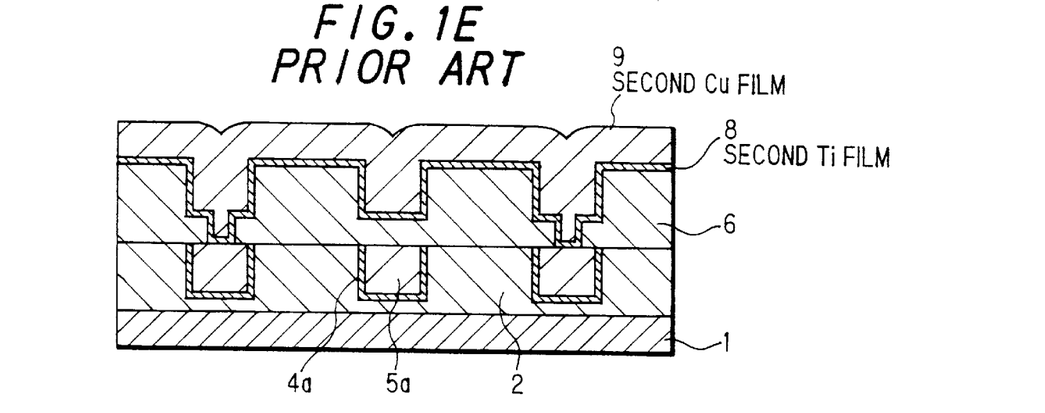

Then, as shown in FIG. 1E, second Ti film 8 and second Cu film 9 are sequentially formed by sputtering, thereby the second interconnect trench 7a and the first interlayer connection hole 7b are filled with.

Figure 1F:
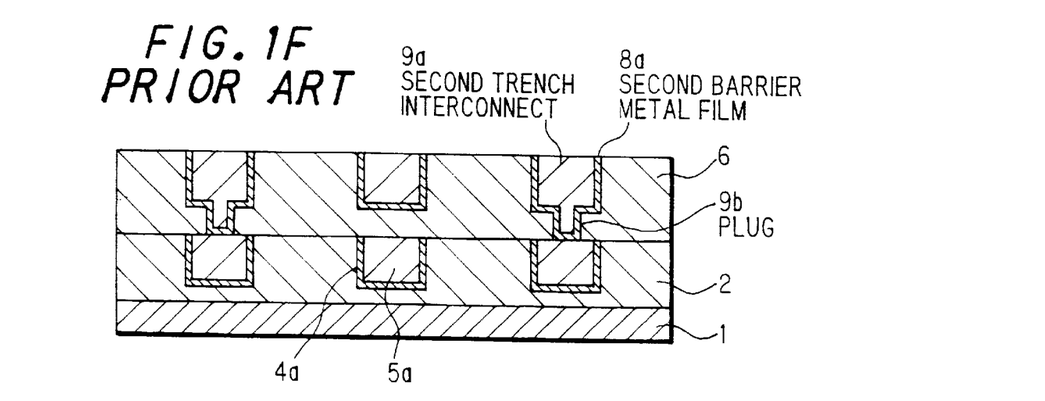

Then, as shown in FIG. 1F, the second Cu film 9 is removed polishing by the CMP method, and further the second Ti film 8 is removed using diluted hydrofluoric acid. Thus, a second trench interconnect 9a on the second layer, and a plug 9b connecting between the first trench interconnect 5a and the second trench interconnect 9a are formed.

This method is also applicable to the case that organic insulation film is used as interlayer insulation film. Such examples are described in D. C. Edelstein et al., Proceedings of 1993 VLSI Multilevel Interconnection Conference, pp.511–513, 1994 and Japanese patent application laid-open No.4-28232 (1992).

Figure 2A:
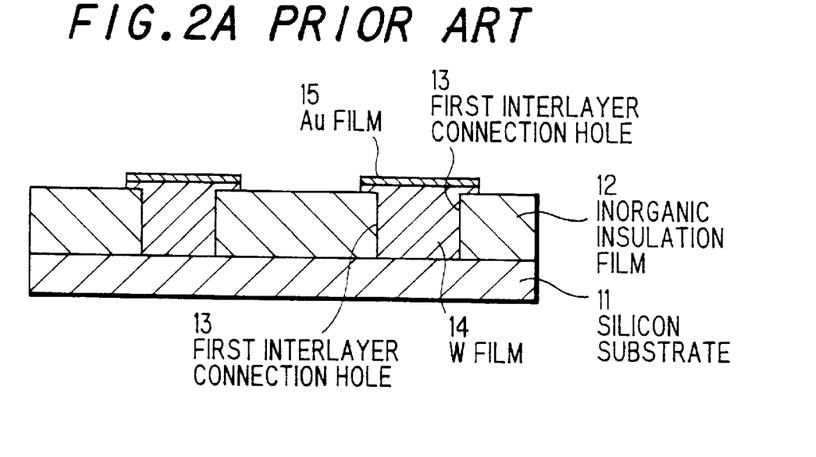
FIGS. 2A to 2E are cross sectional views showing the other conventional method for making a semiconductor device with trench interconnect.
Figure 2B:
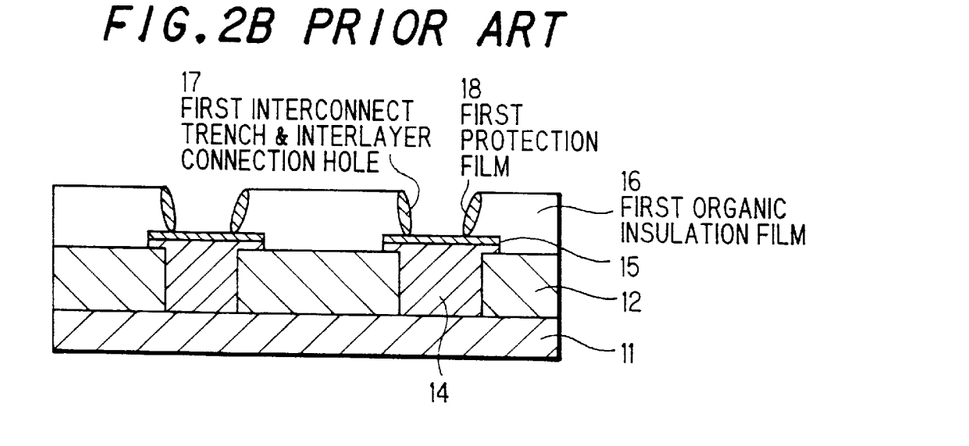
Figure 2C:
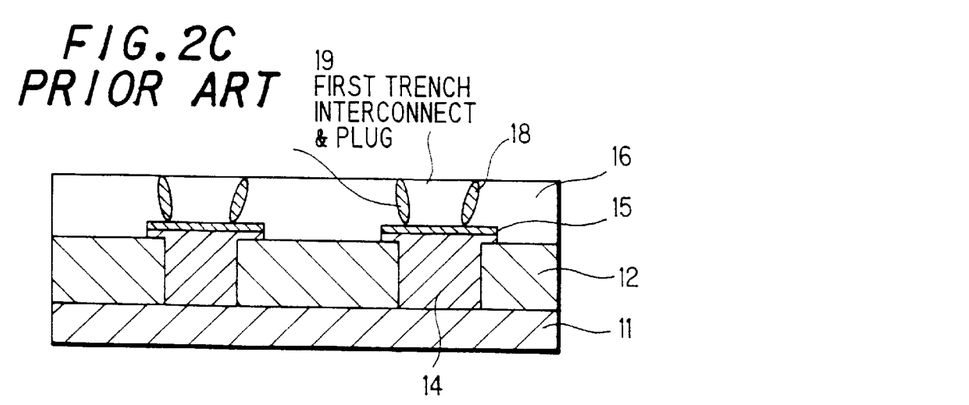
Figure 2D:
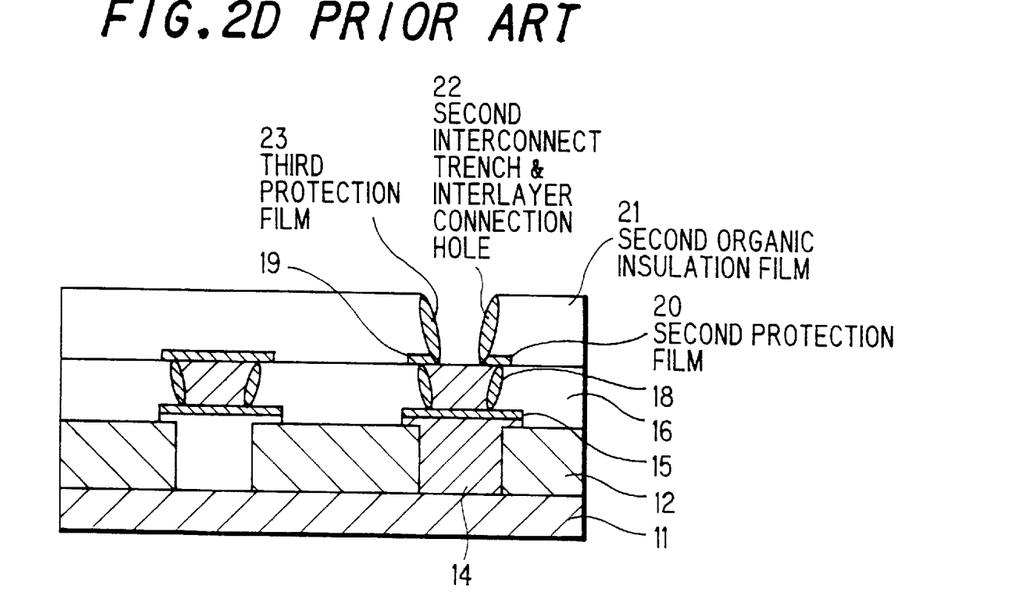
Figure 2E:
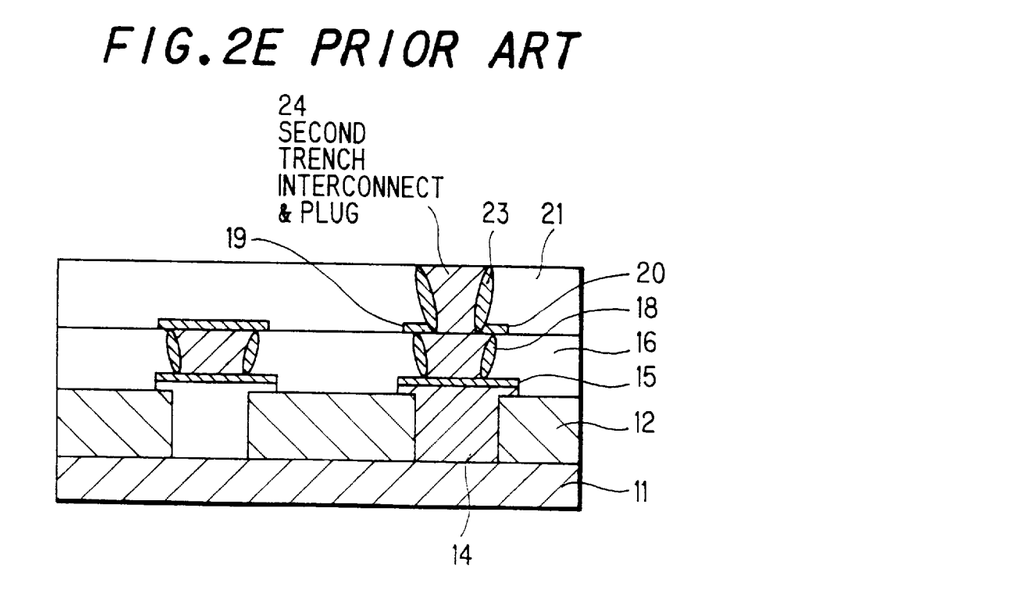

A semiconductor device disclosed in Japanese patent application laid-open No.4-28232 is, as shown in FIG. 2E, composed of organic insulation film 21 formed on a lower trench interconnect 19, an interconnect trench and interlayer connection hole 22 formed in the organic insulation film 21, inorganic insulation film 23 formed on the sidewall of the interconnect trench and interlayer connection hole 22, and an upper trench interconnect and plug 24 buried into the interconnect trench and interlayer connection hole 22. Also disclosed is effects to avoid the direct contact between the organic insulation film 21 and the upper trench interconnect and plug 24, to keep the closeness between the upper trench interconnect and plug 24 and the organic insulation film 21, and to prevent the defect occurrence caused by moisture absorption of the organic insulation film 21.

Referring to FIGS. 2A to 2E, a method of forming the trench interconnect disclosed in Japanese patent application laid-open No.4-28232 is explained. Meanwhile, in this method, gold (Au) is used as metal for the trench interconnect and plug 19, 24, instead of copper.

First, as shown in FIG. 2A, a first interlayer connection hole 13 is formed in inorganic insulation film, which is of silicon oxide, formed on a silicon substrate 11. Then, tungsten (W) film 14 and Au film 15 are deposited on the entire surface, and while leaving only a region for interconnect, unnecessary part of the tungsten (W) film 14 and Au film 15 is removed by photolithography and dry etching.

Subsequently, as shown in FIG. 2B, first organic insulation film 16 of polyimide-system organic resin is formed on the entire surface, and then a first interconnect trench and interlayer connection hole 17 is formed, at part to form an interconnect later, using photolithography and dry etching.

The sidewall of the first interconnect trench and interlayer connection hole 17 is vertical or has such a slope that the trench width decreases in the downward direction and that is close to vertical in the upward direction.

Then, first protection film 18 of inorganic insulation film is deposited on the entire surface, and is etched back by anisotropic reactive ion etching, thereby being left only on the sidewall of the first interconnect trench and interlayer connection hole 17.

Then, as shown in FIG. 2C, Au film is buried into the first interconnect trench and interlayer connection hole 17 by the plating method, thereby a first trench interconnect and plug 19 is formed.

Then, as shown in FIG. 2D, second protection film 20 of inorganic insulation film is further formed on the entire surface. Then, by photolithography and dry etching, the second protection film 20 is left covering the first interconnect trench and interlayer connection hole 17, over the first interconnect trench and interlayer connection hole 17 and in a wider region than the width of the first interconnect trench and interlayer connection hole 17. The other region of the second protection film 20 is removed.

Then, second organic insulation film 21 of polyimide-system resin film is formed, and a second interconnect trench and interlayer connection hole 22 is formed over and inside the first interconnect trench and interlayer connection hole 17, with a narrower width than the width of the first interconnect trench and interlayer connection hole 17. Subsequently, on the sidewall of the second interconnect trench and interlayer connection hole 22, third protection film 23 of inorganic insulation film is formed.

Then, as shown in FIG. 2E, Au film is buried into the second interconnect trench and interlayer connection hole 22 and a second trench interconnect and plug 24 is formed.

After that, the process above is repeated when forming a further multi-layer interconnect.

However, in the method described in S. Lakshminarayanan et al., which uses the inorganic insulation film 6, there exists the barrier metal film 8a around the trench interconnect 9a and the plug 9b. Therefore, when the interconnect width decreases due to the design rule reduction, there is a problem that the ratio (deposition ratio) of main conductive layer (Cu) to the entire interconnect tends to reduce and thereby effective resistivity tends to increase.

Also, there is a problem that the interlayer connection resistance increases due to the existence of the barrier metal film 8a.

Further, in the inorganic insulation film 6, it is difficult to control an increase in capacitance between interconnects or layers occurring with the micro-structuring of device and therefore a delay of circuit cannot be solved. Thus, it is not suitable for the micro-structuring of device.

In contrast with this, in the method described in D. C. Edelstein et al., which uses the organic insulation film, it is possible to control an increase in capacitance between interconnects or layers occurring with the micro-structuring of device. However, since the barrier metal is required to cope with the problem of moisture absorption, an increase in effective resistivity or interlayer connection resistance occurring with the micro-structuring of device cannot be suppressed.

In Japanese patent application laid-open No.4-28232, which discloses the trench interconnect that conductive film is buried into the trench formed in organic insulation film, the inorganic insulation film 23 is provided on the sidewall of the interconnect trench 22 not to contact directly the organic insulation film 21 with the trench interconnect 24, and the width of interconnect is varied between up and down parts so as to improve the closeness therebetween. In this case, the protection by the inorganic insulation film 23 on the sidewall of the interconnect trench 22 is effective by itself.

However, with the development of micro-structuring of pattern, the micro-structuring of trench interconnect and a reduction in connection margin becomes significant. Therefore, it becomes difficult to control the dimensions or shape so that the dimensions are varied between up and down parts of the micro-structured trench interconnect. In particular, for a border-less structure that the trench interconnect and the interlayer connection hole have same dimensions and no connection margin is given, its application is very difficult. Also, when hetero-metal junction is included at the interlayer connection part of a multi-layer interconnect system, since the interlayer connection resistance increases, the delay of circuit cannot be suppressed.

On the other hand, when Cu is used for the trench interconnect 24 in Japanese patent application laid-open No.4-28232, depending on the kind of the inorganic insulation film 23 on the sidewall, Cu in the trench interconnect 24 diffuses into the inorganic insulation film 23 and permeates into neighboring regions, and moisture in the organic insulation film 21 permeates into the trench interconnect 24. Therefore, this may badly affect the long-term reliability of device. Further, when the permittivity of the inorganic insulation film 23 is large, the delay of circuit may not be suppressed due to the increased floating capacitance.

SUMMARY OF THE INVENTION

Accordingly, it is an object of the invention to provide a semiconductor device that an increase in effective resistivity or interlayer connection resistance occurring with the micro-structuring of interconnect can be suppressed as well as reducing the floating capacitance.

According to the invention, a method for making a semiconductor device, comprises the steps of:

forming an organic insulation film to cover a first interconnect or electrode formed on a substrate;

forming an interconnect trench by removing the organic insulation film by etching;

forming a first inorganic insulation film on the organic insulation film to cover the interconnect trench;

introducing nitrogen into at least surface part of the first inorganic insulation film;

forming an interlayer connection hole reaching the first interconnect or electrode by removing the first inorganic insulation film and the organic insulation film inside the interconnect trench and on the first interconnect or electrode by etching;

forming a second inorganic insulation film on the first inorganic insulation film to cover the interconnect trench and the interlayer connection hole;

introducing nitrogen into at least surface part of the second inorganic insulation film;

removing the second inorganic insulation film on the first interconnect or electrode and leaving the second inorganic insulation film on the sidewall of the interconnect trench and the interlayer connection hole; and burying a conductive material into the interconnect trench and the interlayer connection hole, thereby forming a second interconnect or electrode in the interconnect trench, and forming a buried conductive layer connecting between the first interconnect or electrode and the second interconnect or electrode through the interlayer connection hole in the interlayer connection hole.

According to another aspect of the invention, a semiconductor device, comprises:

an organic insulation film in which an interconnect trench is formed;

an inorganic insulation film which is formed covering the side of the interconnect trench and into at least surface part of which nitrogen is introduced; and a trench interconnect or electrode which is buried into the interconnect trench through the inorganic insulation film.

According to another aspect of the invention, a semiconductor device, comprises:

a first interconnect or electrode formed on a substrate;

an organic insulation film which is formed covering the first interconnect or electrode and in which an interconnect trench and an interlayer connection hole reaching from the interconnect trench to the first interconnect or electrode are formed;

an inorganic insulation film which is formed covering the side of the interconnect trench and the interlayer connection hole, and into at least surface part of which nitrogen is introduced;

a second interconnect or electrode buried into the interconnect trench through the inorganic insulation film; and a buried conductive layer which is formed in the interlayer connection hole and connects between the between the first interconnect or electrode and the second interconnect or electrode.

In this invention, the sidewall of interconnect trench formed in organic insulation film or the sidewall of interconnect trench and interlayer connection hole formed in organic insulation film is covered with inorganic insulation film. In addition, nitrogen is introduced into at least surface part of the inorganic insulation film.

Thus, between the interconnect or electrode (hereinafter also referred to as 'trench interconnect') buried in the interconnect trench and the organic insulation film, or between the trench interconnect and buried conductive layer buried in the interconnect trench and interlayer connection hole and the organic insulation film, nitrogen-contained inorganic insulation film, e.g., oxide-nitride film (SiON film) exists. So, the permeation of conductive material into the periphery of trench interconnect etc. and the permeation of moisture into the periphery of organic insulation film can be further suppressed.

Also, as the inorganic insulation film on the sidewall of the interconnect trench and interlayer connection hole, silicon oxide film including fluorine is used. Although the inorganic insulation film exists between up and down or right and left trench interconnects, since silicon oxide film including fluorine has a low permittivity, the floating capacitance occurring between up and down or right and left trench interconnects can be further reduced.

Further, by burying a conductive material into the interconnect trench and the interlayer connection hole, a second interconnect or electrode is formed in the interconnect trench, and a buried conductive layer connecting between the first interconnect or electrode and the second interconnect or electrode through the interlayer connection hole is formed in the interlayer connection hole.

For example, a buried conductive layer, which is of the same conductive material as the trench interconnect, is formed, and through this buried conductive layer, between up and down trench interconnects or between the trench interconnect and a normal interconnect are connected.

Therefore, without using barrier metal generally having a high permittivity, the trench interconnects can be connected each other. So, an increase in effective resistivity or interlayer connection resistance occurring with the microstructuring of interconnect can be suppressed.

BRIEF DESCRIPTION OF THE DRAWINGS

The invention will be explained in more detail in conjunction with the appended drawings, wherein.

DESCRIPTION OF THE PREFERRED EMBODIMENTS

The preferred embodiments of this invention will be explained below, referring to the drawings.

<First Embodiment>

FIGS. 3A to 3H and 4 are cross sectional views showing sequentially the steps of a method for making a semiconductor device in the first preferred embodiment according to the invention.

Figure 3A:
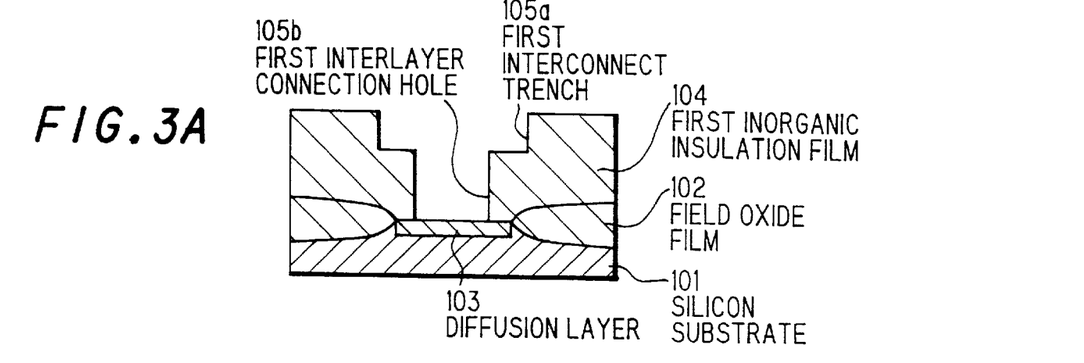
FIGS. 3A to 3H are cross sectional views showing sequentially a method for making a semiconductor device in a first preferred embodiment according to the invention.
Figure 3B:
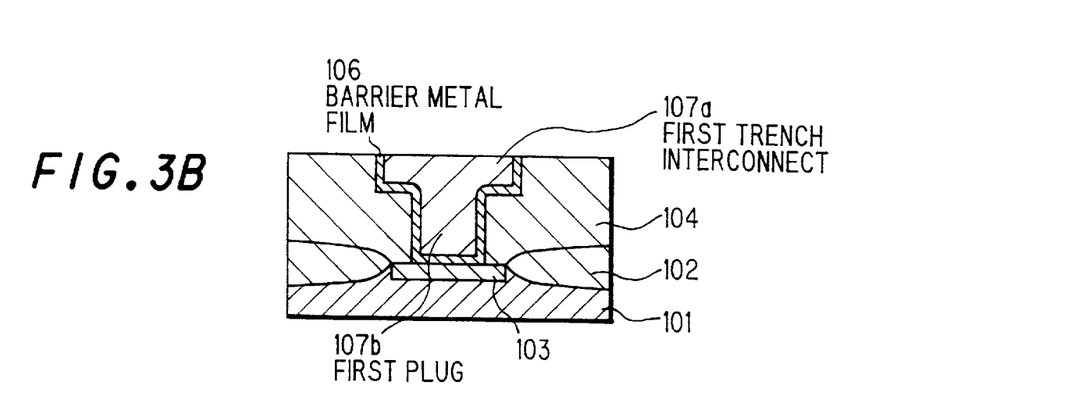
Figure 3C:
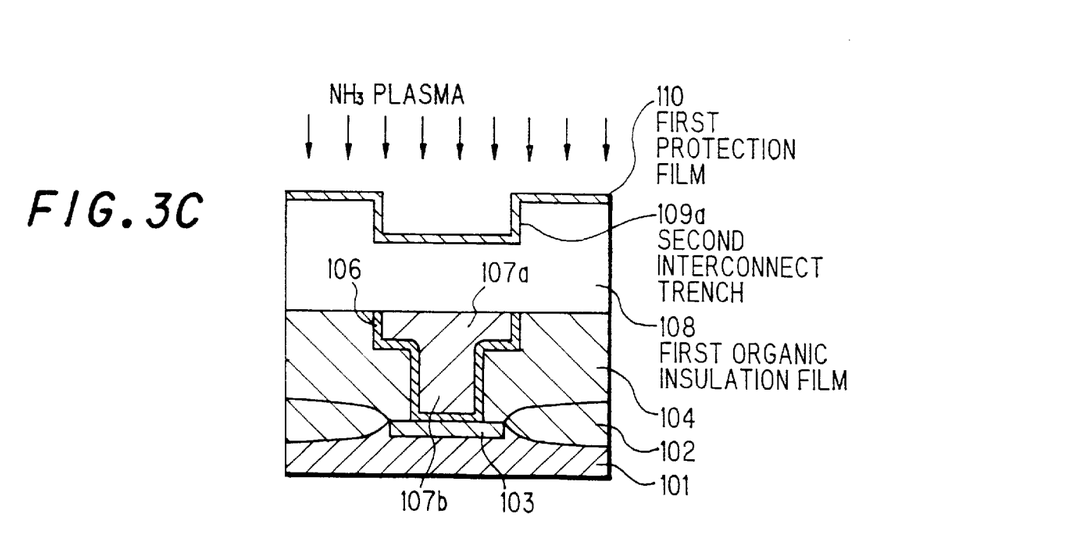
Figure 3D:
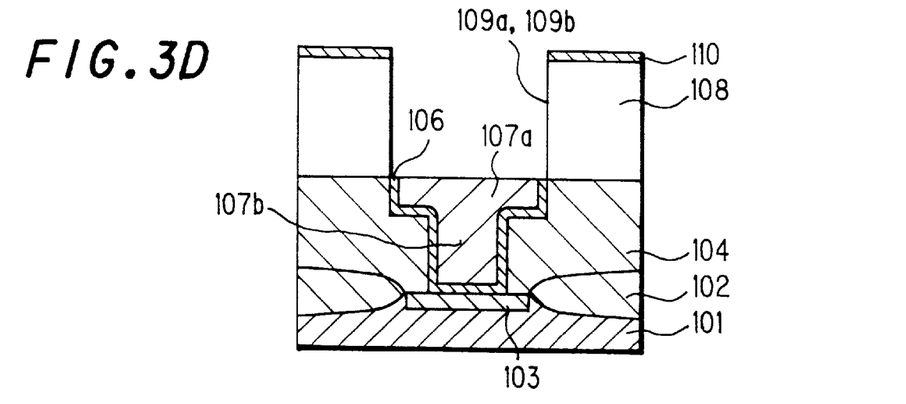
Figure 3E:
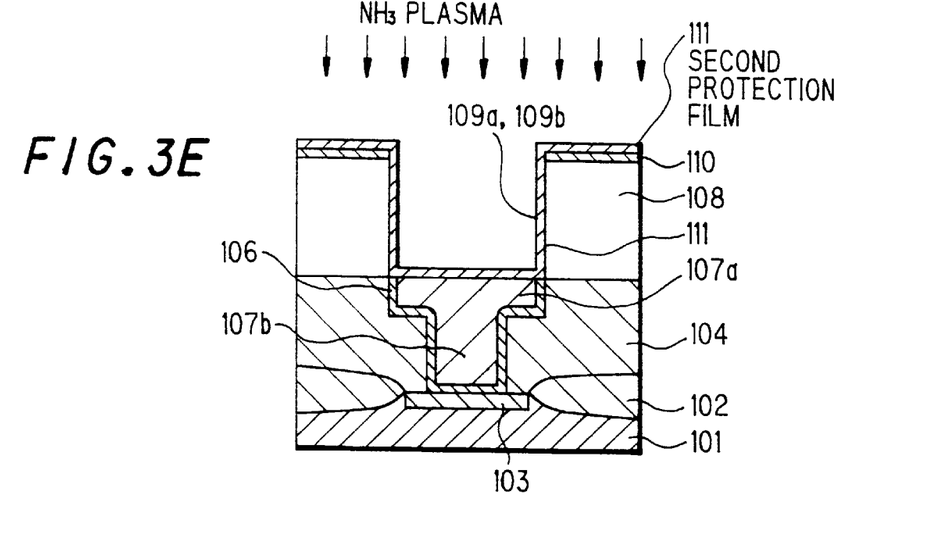
Figure 3F:
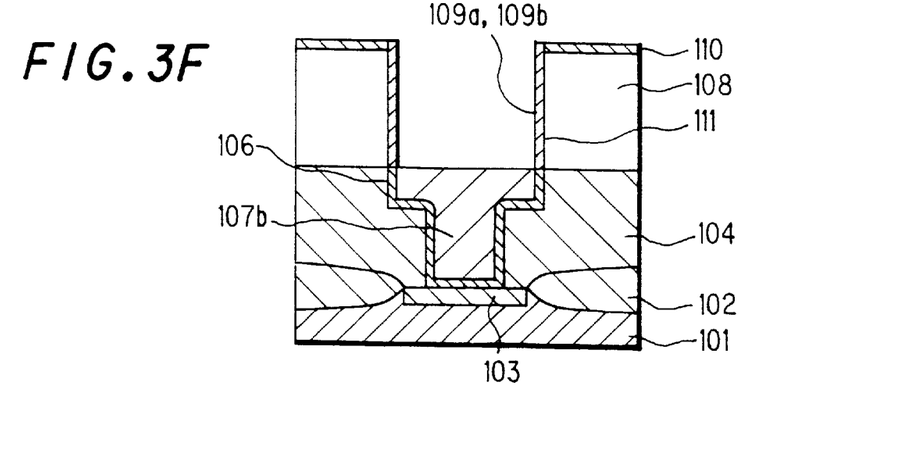
Figure 3G:
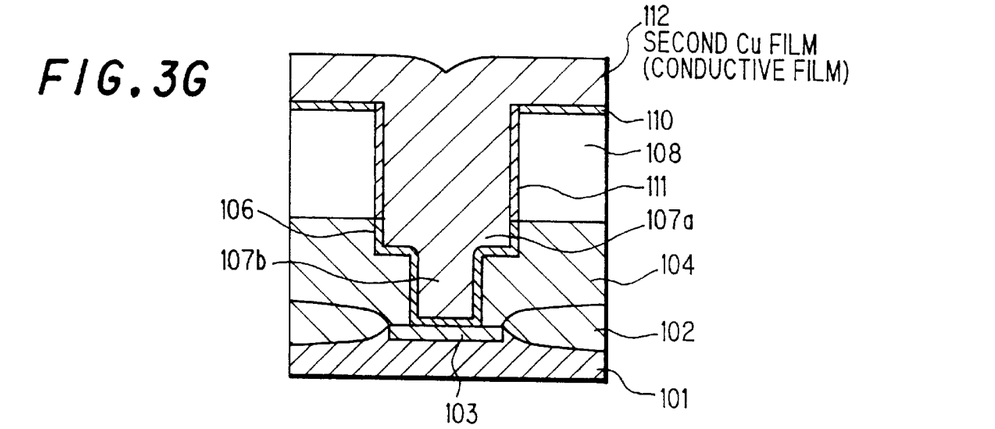
Figure 3H:
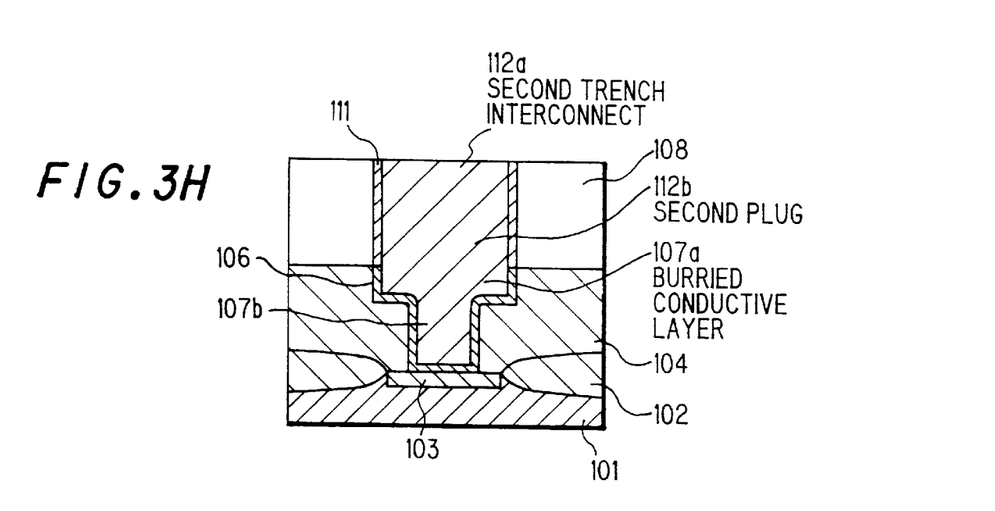

The semiconductor device in this embodiment is, as shown in FIG. 3H, characterized in that an upper trench interconnect (second trench interconnect 112a) and a connection plug (second plug (buried conductive layer) 112b) connecting between the upper and lower trench interconnects do not have barrier metal.

To obtain this semiconductor device, at first, as shown in FIG. 3A, field oxide film 102 is formed on a silicon substrate 101 by selective oxidation method using a known method such as dry etching, and then a diffusion layer 103 of a conductive type reverse to that of the silicon substrate 101 is formed by ion-implanting the silicon substrate 101 between the field oxide films 102. Then, first inorganic insulation film 104 of about 1.5 µm silicon oxide film is on the entire surface.

Then, by the dry etching method using resist film as a mask, a first interconnect trench 105a of 200 to 800 nm wide and 250 to 500 nm deep is formed in the first inorganic insulation film 104. Then, using resist film (not shown) as a mask, the first inorganic insulation film 104 under the first interconnect trench 105a and over the diffusion layer 103 is removed by etching, thereby a first interlayer connection hole 105b of 0.75 to 1 µm deep, which is reaching the diffusion layer 103, is formed.

Then, as shown in FIG. 3B, a silicide layer (not shown) of titanium (Ti) or cobalt (Co) is formed on the diffusion layer 103 so as to reduce the contact resistivity. Then, by a known reactive sputtering method using Ti as a target or a CVD method using titanium tetrachrolide (TiCl$_4$) and ammonia (NH$_3$) as sources, about 100 nm thick titanium nitride (TiN) film that covers the first interconnect trench 105a and the first interlayer connection hole 105b and contacts the diffusion layer 103 is deposited. The titanium nitride film is barrier metal film 106.

Then, first copper film (Cu film) of 1 to 1.5 µm thick is deposited by the sputtering or CVD method on the barrier metal film 106 of titanium nitride film, thereby the inside of the first interconnect trench 105a and the first interlayer connection hole 105b is filled with.

Then, the first Cu film and TiN film on the first inorganic insulation film 104 are removed by the CMP method. Thus, first trench interconnect (first interconnect or electrode) 107a of the first Cu film and a first plug 107b to connect between the first trench interconnect 107a and the diffusion layer 103 through the first interlayer connection hole 105b are formed.

Then, as shown in FIG. 3C, using the spin coating method, 1.5 µm thick first organic insulation film 108 composed of organic insulation material with a low permittivity, typically such as polyimide, is formed on the first inorganic insulation film 104 and the first trench interconnect 107a.

Then, using resist film (not shown) as a mask, using the anisotropic dry etching method as a known technique, a second interconnect trench 109a of 200 to 800 nm wide and 250 to 500 nm deep is formed. Here, part of the second interconnect trench 109a intersects over the first trench interconnect 107a.

Then, by the plasma CVD method using titanium tetrachrolide (TiCl$_4$) as a source, 10 to 30 nm thick first protection film (first inorganic insulation film) 110 of fluorine-contained silicon oxide film (SiOF film), which has, of inorganic insulation films, a low permittivity, is formed.

Further, the first protection film 110 is exposed to NH$_3$ plasma in a low-pressure chamber (not shown).

By this plasma treatment, nitrogen is introduced into the first protection film 110. Nitrogen introduced into the first protection film 110 is bonded to Si and O composing the first protection film 110, thereby about 10 nm thick oxide-nitride film (SiON film) is formed at the surface part of the first protection film 110.

Here, it is preferable that the conditions of NH$_3$ plasma treatment are, in case of using a single-wafer processing type low-pressure chamber, a substrate temperature of 200 to 400° C., an NH$_3$ flow rate of 50 to 100 SCCM, a pressure of 0.2 to 5.0 Torr, electric power of 0.1 to 0.4 W/cm$^2$, and plasma treatment time of 3 to 10 min. However, since the introduction amount of nitrogen and the introduction depth are varied depending on the treatment conditions, the conditions of NH$_3$ plasma treatment are necessary to optimize according to the kind, structure or characteristic of a semiconductor device applied.

The SiON layer thus formed has a high barrier property against impurity, and it is confirmed that even when a thermal treatment at 450° C. and for 30 min. is conducted, it prevents an element, such as Cu, that strongly affects to transistor from diffusing.

Also, although SiOF film including nitrogen may be formed under the SiON film depending on the plasma treatment conditions, this film does not matter since it does not deteriorate the barrier property to conductive film formed later.

Further, even when about 10 nm thick oxide-nitride film (SiON film) is formed at the surface part of the first protection film 110, since the nitrogen-doped region is very thin, the permittivity of the first protection film 110 increase little, and therefore the capacitance between interconnects also increase little.

Then, as shown in FIG. 3D, using the anisotropic dry etching or wet etching and using resist film (not shown) as a mask, the first protection film 110 and the first organic insulation film 108, which are over the first trench interconnect 107a and under the second interconnect trench 109a, are removed by etching. Thereby, a second interlayer connection hole 109b that has a same diameter as the width of the second interconnect trench 109a and reaches the first trench interconnect 107a is formed. Hereupon, the first protection film 110 inside the second interconnect trench 109a is all removed.

Meanwhile, although the diameter of the second interlayer connection hole 109b is the same as the width of the second interconnect trench 109a in this embodiment, it does not have to be equal to the width of second interconnect trench 109a and may be shorter than it.

Then, by the plasma CVD method using silicon tetrafluolide (SiF$_4$) as a source, 10 to 30 nm thick second protection film 111 of fluorine-contained silicon oxide film (SiOF film) is formed on the entire surface.

Further, as shown in FIG. 3E, the second protection film 111 is exposed to NH$_3$ plasma in a low-pressure chamber. Hereupon, similarly to the case of first protection film 110, an about 10 nm thick SiON layer is formed at the surface part of the second protection film 111.

The SiON layer formed at the surface part of the second protection film 111, similarly to the case of first protection film 110, has a high barrier property against impurity, and the permittivity of the second protection film 111 increase little since it is as thin as 10 nm.

Then, as shown in FIG. 3F, using the dry etching method using fluorocarbon-system gas such as CF$_4$ and C$_2$F$_6$, the second protection film 111 is etched back by anisotropic etching. Thereby, only the second protection film 111 on the first protection film 110 and on the first trench interconnect 107a is removed and the second protection film 111 on the sidewall of the second interconnect trench 109a and the second interlayer connection hole 109b is left.

Figure 4:
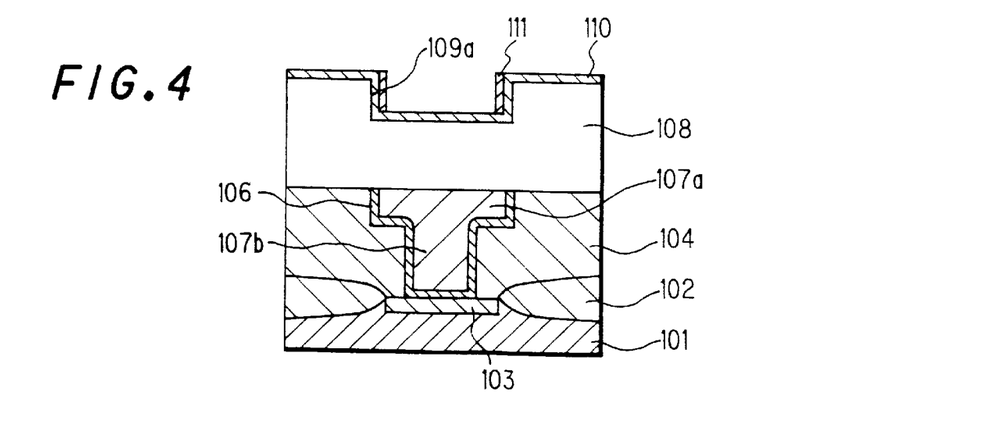
FIG. 4 is a cross sectional view showing a region except the periphery of a region where a trench interconnect is formed just after completing the step in FIG. 3F.

In this case, the cross sectional structure except the region where the second interlayer connection hole is formed is as shown in FIG. 4. Namely, as shown in FIG. 4, the first protection film 110 is left inside the second interconnect trench 109a and on the first organic insulation film 108, and the second protection film 111 is left only on the sidewall of the second interconnect trench 109a.

Figure 5:
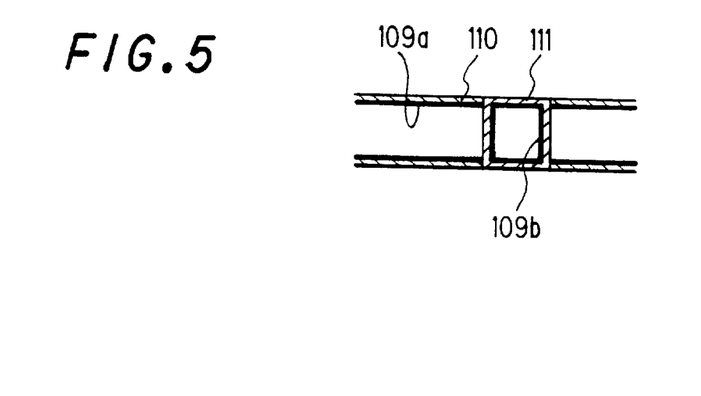
FIG. 5 is a plan view showing the location of a region where a trench interconnect is formed and its periphery just after completing the step in FIG. 3F, and FIGS. 6A and 6B are cross sectional views showing a method for making a semiconductor device in a second preferred embodiment according to the invention.

FIG. 5 is a plan view showing the location of the second interconnect trench 109a and the second interlayer connection hole 109b. As shown, the first organic insulation film 108 at the bottom of the second interconnect trench 109a is protected by the first protection film 110, and the first organic insulation film 108 on the sidewall thereof is protected by the first protection film 110 and the second protection film 111. Also, the first organic insulation film 108 around the second interlayer connection hole 109b is protected by the second protection film 111.

Namely, without using the barrier metal film, the structure that conductive film formed later does not contact directly the first organic insulation film 108 can be obtained. The conductive film formed later is isolated from the first organic insulation film 108 by at least one of the first protection film 110 and the second protection film 111 which have a high barrier property. Therefore, when the conductive film has a problem such as oxidation, corrosion and reaction in relation to the first organic insulation film 108, this problem can be solved.

Then, as shown in FIG. 3G, by a known CVD method using bis-hexafluoroacethylacetonite copper (Cu(C$_5$HF$_6$O$_2$) as a source, second Cu film (conductive film) 112 of 1 to 1.5 μm thick is deposited, and buried into the second interconnect trench 109a and the second interlayer connection hole 109b.

Then, as shown in FIG. 3H, the second Cu film 112 and the first protection film 110 are removed by the CMP method using a slurry mainly composed of alumina (Al$_2$O$_3$) particles. Thus composed are second trench interconnect (second interconnect or electrode) 112a composed of second Cu film 112, and a second plug (buried conductive layer) 112b connecting between the first trench interconnect 107a and the second trench interconnect 112a.

As explained above, according to this method, in the trench interconnect 112a and the buried conductive layer 112b, no barrier metal is necessary. Therefore, the ratio of main conductive layer (Cu) occupying the trench interconnect 112a and the buried conductive layer 112b is always 100%. Accordingly, even when the trench interconnect is micro-structured, a certain resistivity can be obtained and its value is always lower than that in using the barrier metal.

Further, since the connection between the upper and lower interconnects is given as the contact between like metals, a connection resistance lower than that in using the barrier metal can be obtained.

Also, since insulation film with a low permittivity is generally used around the trench interconnect 112a, the capacitance between adjacent trench interconnects or up and down trench interconnects can be reduced much lower than that in the conventional method.

If necessary, by repeating the steps above, the trench interconnects can be further multi-layered.

<Second Embodiment>

The second preferred embodiment of this invention is explained below.

Figure 6A:
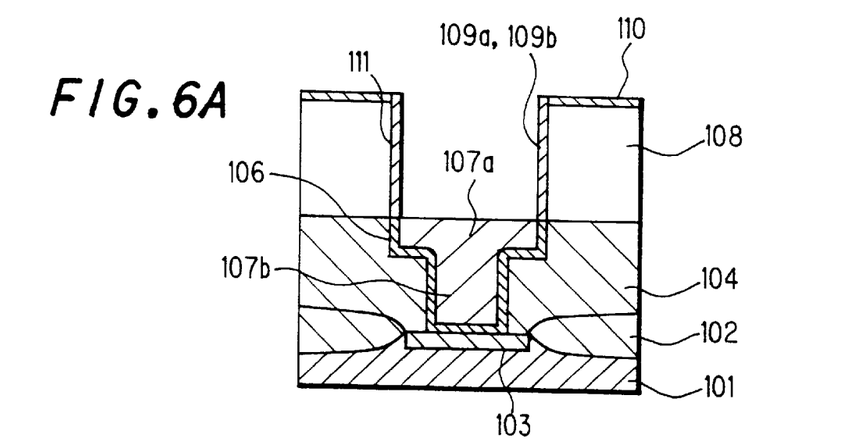
Figure 6B:
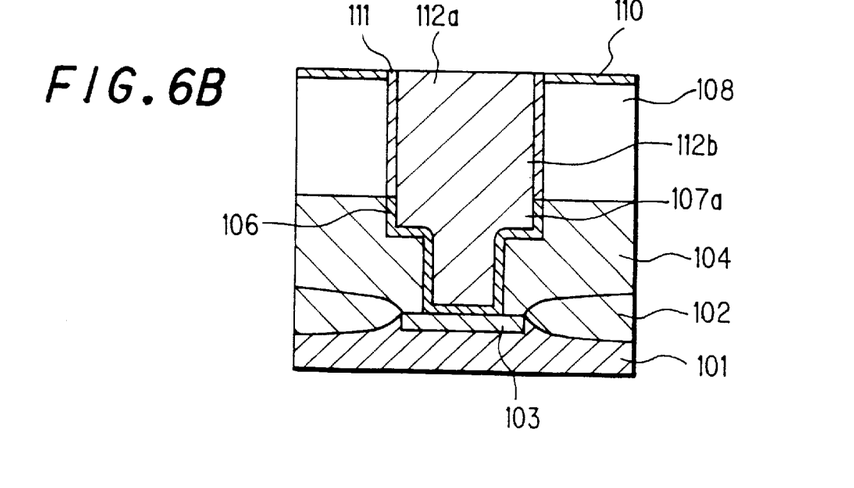

FIGS. 6A and 6B are cross sectional views showing sequentially a method for making a semiconductor device in the second preferred embodiment according to the invention. The difference of this embodiment from the first embodiment is that the second trench interconnect (second interconnect and electrode) 112a and the second plug (buried conductive layer) 112b connecting the first trench interconnect 107a and the second trench interconnect 112a are formed depositing selectively by electroless plating (instead of the CVD method).

First, using the same materials and techniques as those in the first embodiment, through the same steps in FIGS. 3A to 3F in the first embodiment, as shown in FIG. 6A, the silicon substrate 101, field oxide film 102, diffusion layer 103, first inorganic insulation film 104a, first interconnect trench 105a, first interlayer connection hole 105b, barrier metal film 106, first trench interconnect 107a and first plug 107b composed of first Cu film are formed. Then, the second interconnect trench 109a and the second interlayer connection hole 109b that has a same diameter as the width of the second interconnect trench 109a and reaches the first trench interconnect 107a are formed.

Hereupon, as shown in FIG. 3F, the first organic insulation film 108 on the sidewall of the second interconnect trench 109a and second interlayer connection hole 109b is protected by the second protection film 111. The first trench interconnect 107a is exposed at the bottom of the second interlayer connection hole 109b.

Then, as shown in FIG. 6B, second Cu film of 1 to 1.5 $\mu$m thick is deposited selectively only on the first trench interconnect 107a by electroless plating, and buried inside the second interconnect trench 109a and second interlayer connection hole 109b. Thus composed are second trench interconnect (second Cu film) 112a, and the second plug (second Cu film) 112b connecting between the first trench interconnect 107a and the second trench interconnect 112a.

As explained above, in the second embodiment, since the outermost surface of the first organic insulation film 108 is also covered with the protection film, the moisture absorption that is one of the defects of first organic insulation film 108 can be also solved, therefore the long-term reliability can be improved.

Also, for the trench interconnect 112a thus formed, like the first embodiment, even when the trench interconnect is micro-structured, a certain interconnect resistivity can be always obtained, and a low connection resistance can be obtained. Also, the capacitance between adjacent trench interconnects or up and down trench interconnects can be reduced much lower than that in the conventional method. Therefore, the delay of circuit can be suppressed effectively.

Although the embodiments of the invention are described above in reference to the drawings, the invention is not limited to these embodiments. All alterations in design etc. that fall within the subject matter of the invention are included in the invention.

For example, the material of the first organic insulation film 108, which is polyimide in the embodiments, may be another organic insulation material with a low permittivity. Also, as the method of forming the film, the CVD method can be used instead of the spin coating.

The introduction of nitrogen into the first and second protection films 110, 111 by $NH_3$ plasma can be performed by using a batch processing type low-pressure chamber other than the single-wafer processing type low-pressure chamber.

Also, as the source used for the introduction of nitrogen, another gas including nitrogen can be used instead of $NH_3$. For example, the doping by $N_2$ gas may be conducted. However, $N_2$ has a low doping amount of nitrogen, while it is more inexpensive than $NH_3$. So, $NH_3$ is more advantageous to introduce nitrogen in high-concentration for a short time.

Also, the deposition of second Cu film can be conducted by the other film-forming methods, such as sputtering, instead of the CVD method and electroless plating.

Further, the composition of the invention can be applied to any semiconductor device such as a MOS transistor, a bipolar transistor etc. if the semiconductor device is provided with the trench interconnect 112a and plug 112b buried in the trench interconnect 109a and second interlayer connection hole 109b which are formed in the first organic insulation film 108.

Although the invention has been described with respect to specific embodiment for complete and clear disclosure, the appended claims are not to be thus limited but are to be construed as embodying all modifications and alternative constructions that may be occurred to one skilled in the art which fairly fall within the basic teaching here is set forth.

What is claimed is:

1. A semiconductor device, comprising:
an organic insulation film in which an interconnect trench is formed;
an inorganic insulation film which is formed covering the side of said interconnect trench and into at least surface part of which nitrogen is introduced; and
a trench interconnect or electrode which is buried into said interconnect trench through said inorganic insulation film.

2. A semiconductor device, comprising:
a first interconnect or electrode formed on a substrate;
an organic insulation film which is formed covering said first interconnect or electrode and in which an interconnect trench and an interlayer connection hole reaching from said interconnect trench to said first interconnect or electrode are formed;
an inorganic insulation film which is formed covering the side of said interconnect trench and said interlayer connection hole, and into at least surface part of which nitrogen is introduced;
a second interconnect or electrode buried into said interconnect trench through said inorganic insulation film; and
a buried conductive layer which is formed in said interlayer connection hole and connects between said between said first interconnect or electrode and said second interconnect or electrode.

3. A semiconductor device, according to claim 1, wherein:
said inorganic insulation film is of silicon oxide film including fluorine.

4. A semiconductor device, according to claim 2, wherein:
said inorganic insulation film is of silicon oxide film including fluorine.

5. A semiconductor device, according to claim 1, wherein:
the material for said second interconnect or electrode and said first interconnect or electrode is copper, silver or gold.

6. A semiconductor device, according to claim 2, wherein:
the material for said second interconnect or electrode and said first interconnect or electrode is copper, silver or gold.

* * * * *